(12) United States Patent
Wang et al.

(10) Patent No.: US 9,813,034 B2
(45) Date of Patent: Nov. 7, 2017

(54) AMPLIFICATION CIRCUIT AND METHOD OF COMPENSATING FOR VOLTAGE OFFSET OF INPUTS

(71) Applicant: MARVELL WORLD TRADE LTD, St. Michael (BB)

(72) Inventors: Yongxu Wang, Shanghai (CN); Wenrong Qian, Shanghai (CN); Kapil Jain, Santa Clara, CA (US); Song Chen, Shanghai (CN); Xiaoxiao Zhao, Shanghai (CN)

(73) Assignee: Marvell World Trade Ltd., St. Michael (BB)

( * ) Notice: Subject to any disclaimer, the term of this patent is extended or adjusted under 35 U.S.C. 154(b) by 0 days.

(21) Appl. No.: 15/204,040

(22) Filed: Jul. 7, 2016

(65) Prior Publication Data
US 2017/0012589 A1    Jan. 12, 2017

Related U.S. Application Data

(60) Provisional application No. 62/189,479, filed on Jul. 7, 2015, provisional application No. 62/233,553, filed on Sep. 28, 2015.

(51) Int. Cl.
*H04R 29/00* (2006.01)
*H03G 1/00* (2006.01)
(Continued)

(52) U.S. Cl.
CPC ....... *H03G 1/0035* (2013.01); *H03F 3/45475* (2013.01); *H03F 3/45973* (2013.01);
(Continued)

(58) Field of Classification Search
CPC ...... H03G 1/0035; H03G 1/00; H03G 3/3063; H03F 3/45475; H03F 3/45973;
(Continued)

(56) References Cited

U.S. PATENT DOCUMENTS

| 5,430,765 A * | 7/1995 | Nagahori ........... H04B 10/6933 330/259 |
| 2006/0001493 A1 | 1/2006 | Harms et al. |

(Continued)

OTHER PUBLICATIONS

International Search Report and Written Opinion dated Sep. 22, 2016 in PCT/US2016/041224.

*Primary Examiner* — Md S Elahee
*Assistant Examiner* — Sabrina Diaz (57) ABSTRACT

Aspects of the disclosure provide an amplification circuit. The amplification circuit includes an amplifier and a first variable resistive device. The amplifier includes first and second input nodes configured to receive the first and second input electrical signals and first and second output nodes configured to output first and second output electrical signals having amplified voltages relative to the first and second input electrical signals. The first variable resistive device is electrically coupled to the second input node of the amplifier. The first variable resistive device being configured to have a selected resistance value to compensate for a direct current (DC) voltage difference between the first and second input electrical signals based on a DC voltage difference between first and second output electrical signals that are output from the first and second output nodes of the amplifier.

18 Claims, 7 Drawing Sheets

(51) Int. Cl.
*H03F 3/45* (2006.01)
*H04R 3/10* (2006.01)

(52) U.S. Cl.
CPC ............ *H04R 3/10* (2013.01); *H03F 2200/78* (2013.01); *H03F 2203/45212* (2013.01)

(58) Field of Classification Search
CPC ........... H03F 2200/78; H03F 2200/381; H03F 2203/45212; H03F 2203/45214; H04R 3/10; H04R 3/11; H04R 21/00; H04R 5/04
USPC ............................................ 381/58, 28, 120
See application file for complete search history.

(56) References Cited

U.S. PATENT DOCUMENTS

| | | | |
|---|---|---|---|
| 2011/0133837 A1* | 6/2011 | Komori | H03F 3/45475 330/254 |
| 2012/0206197 A1* | 8/2012 | Yamazaki | H03F 3/45475 330/69 |
| 2013/0257536 A1 | 10/2013 | Sharma et al. | |
| 2014/0097331 A1* | 4/2014 | Tsunoda | H03F 3/08 250/214 A |

* cited by examiner

AMPLIFICATION CIRCUIT AND METHOD OF COMPENSATING FOR VOLTAGE OFFSET OF INPUTS

INCORPORATION BY REFERENCE

This present disclosure claims the benefit of U.S. Provisional Application No. 62/189,479, "Removal of Direct Current Isolating Capacitor used for Audio Microphone" filed on Jul. 7, 2015, and U.S. Provisional Application No. 62/233,553, "Differential Calibration Circuit for Removal of Blocking Capacitor from Audio Microphone" filed on Sep. 28, 2015, which are incorporated herein by reference in their entireties.

FIELD

This disclosure relates generally to an amplification circuit. More specifically, the disclosure relates to apparatus and methods for compensating for differences in (DC) voltage inputs to an amplifier.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

In various applications, such as, for example, amplifiers for microphones, an amplification circuit receives a pair of differential input signals in an analog domain and amplifies the differential input signals. Without mitigating a voltage offset between the differential input signals, differences in DC voltage levels of the differential signals are also undesirably amplified. In some conventional applications, DC blocking capacitive devices are used to mitigate the mutual voltage offset of the input differential signals. However, such conventional DC blocking capacitive devices typically occupy a relatively large area and result in large and complex circuitry.

SUMMARY

Aspects of the disclosure include an amplification circuit. The amplification circuit includes an amplifier and a first variable resistive device. The amplifier includes first and second input nodes configured to receive the first and second input electrical signals and first and second output nodes configured to output first and second output electrical signals having amplified voltages relative to the first and second input electrical signals. The first variable resistive device is electrically coupled to the second input node of the amplifier. The first variable resistive device being configured to have a selected resistance value to compensate for a direct current (DC) voltage difference between the first and second input electrical signals based on a DC voltage difference between first and second output electrical signals that are output from the first and second output nodes of the amplifier.

In an embodiment, the amplification circuit further includes a first reference voltage node configured to receive a first reference voltage, and the first variable resistive device is electrically coupled between the second input node of the amplifier and the first reference voltage node.

In an embodiment, the amplification circuit further includes a DC voltage difference detector and a controller. The DC voltage difference detector is configured to generate a detection result indicating the DC voltage difference between the first and second output electrical signals. The controller is configured to determine a set of settings, for setting the resistance value of the first variable resistive device, based on the detection result when the amplification circuit is in a calibration mode.

In an embodiment, the set of settings for setting the resistance value of the first variable resistive device includes a binary code. The controller is further configured to determine the binary code based on a successive approximation approach.

Aspects of the disclosure provide an audio sensing circuit. The audio sensing circuit includes an audio sensor, an amplifier, a first set of resistive devices, and a first variable resistive device. The audio sensor is electrically coupled between first and second supply voltage nodes. The amplifier includes first and second input nodes configured to receive the first and second input electrical signals and first and second output nodes configured to output first and second output electrical signals having amplified voltages relative to the first and second input electrical signals. The first set of resistive devices is electrically coupled between the second input node of the amplifier and the second supply voltage node through the audio sensor. The variable resistive device is electrically coupled to the second input node of the amplifier. The variable resistive device being configured to have a selected resistance value to compensate for a direct current (DC) voltage difference between the first and second input electrical signals based on a DC voltage difference between first and second output electrical signals that are output from the first and second output nodes of the amplifier.

In an embodiment, the variable resistive device is electrically coupled between the second input node of the amplifier and the first supply voltage node.

In an embodiment, the audio sensing circuit further includes a DC voltage difference detector and a controller. The DC voltage difference detector is configured to generate a detection result indicating the DC voltage difference between the first and second output electrical signals. The controller is configured to determine a set of settings, for setting the resistance value of the variable resistive device, based on the detection result when the audio sensing circuit is in a calibration mode.

In an embodiment, the set of settings for setting resistance value of the variable resistive device includes a binary code. The controller is further configured to determine the binary code based on a successive approximation approach.

Aspects of the disclosure provide a method of adjusting an input direct current (DC) voltage difference between first and second input electrical signals at first and second input nodes of an amplifier of an amplification circuit. The method includes generating a detection result indicating a DC voltage difference between first and second output electrical signals that are output from first and second output nodes of the amplifier. The method also includes setting a variable resistive device electrically coupled to the second input node of the amplifier to have a selected resistance value to compensate for the DC voltage difference between the first and second input electrical signals at the first and second input nodes of the amplifier based on the DC voltage difference between the first and second output electrical signals that are output from the first and second output nodes of the amplifier.

In an embodiment, the method further includes applying a reference voltage to a reference voltage node, the variable resistive device being electrically coupled between the reference voltage node and the second input node of the amplification circuit.

In an embodiment, the method includes generating a detection result indicating the DC voltage difference between the first and second output electrical signals and determining a set of settings, for setting the resistance value of the variable resistive device, based on the detection result when the amplification circuit is in a calibration mode.

In an embodiment, the set of settings for setting resistance value of the variable resistive device includes a binary code, and the method further comprises determining the binary code for setting the resistance value of the variable resistive device based on a successive approximation approach.

BRIEF DESCRIPTION OF THE DRAWINGS

Various embodiments of this disclosure that are proposed as examples will be described in detail with reference to the following figures, wherein like numerals reference like elements, and wherein.

DETAILED DESCRIPTION OF EMBODIMENTS

Voltage levels of differential electrical signal provided by a device to an amplifier typically are mutually offset, for a variety of reasons. Conventionally voltage offset in the input signals is compensated for using capacitance blocking techniques which tend to be expensive. In the current disclosure, an alternative technique is proposed, namely to determine a voltage difference at output terminals of an amplifier, and then set an impedance level of one or both of the inputs to the amplifier, using a variable resistor, to compensate for the offset.

Figure 1:
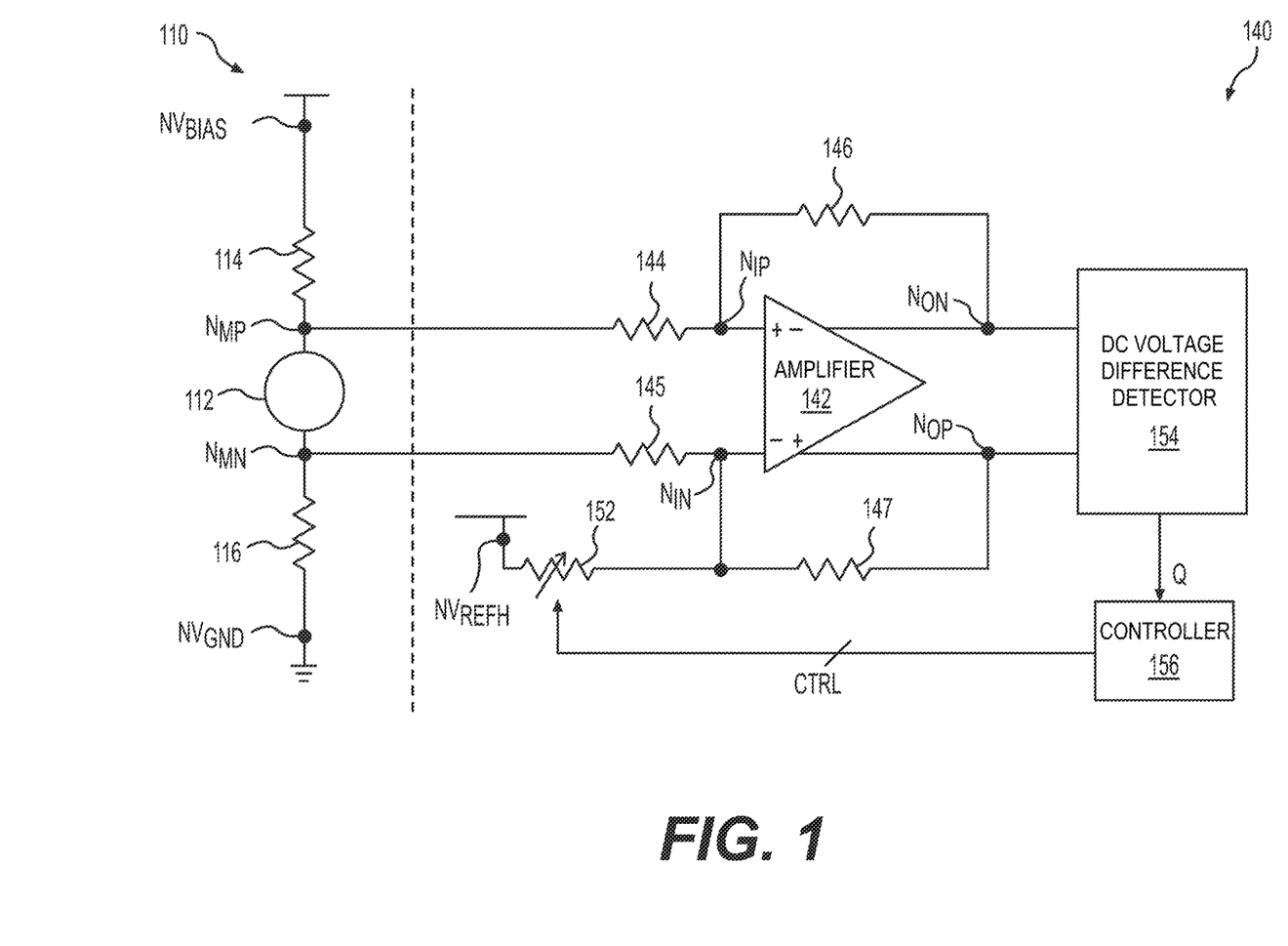
FIG. 1 shows a circuit schematic diagram of an audio sensor and an amplification circuit according to one or more embodiments of the disclosure.

FIG. 1 shows a circuit schematic diagram of an audio sensor 110 and an amplification circuit 140 according to one or more embodiments of the disclosure. The combination of audio sensor 110 and the amplification circuit 140 is also referred to as an audio sensing circuit. In some examples, the amplification circuit 140 is implemented on an integrated circuit chip and obviates DC blocking capacitance techniques, in an embodiment. In some examples, the audio sensor 110 is implemented on the integrated circuit chip where the amplification circuit 140 is disposed or outside the integrated circuit chip.

The audio sensor 110 is electrically coupled between a first supply voltage node (labeled as "$NV_{BIAS}$") and a second supply voltage node (labeled as "$NV_{GND}$") and includes a microphone 112 and resistive devices 114 and 116. The microphone 112 is configured to generate a pair of output signals at a first audio output node (labeled as "$N_{MP}$") and a second audio output node (labeled as "$N_{MN}$"). The resistive device 114 is electrically coupled between the first supply voltage node $NV_{BIAS}$ and the first audio output node $N_{MP}$. The resistive device 116 is electrically coupled between the second supply voltage node $NV_{GND}$ and the second audio output node $N_{MN}$.

In some examples, the microphone 112 has an equivalent resistance value ranging from 500 Ohms to 2000 Ohms. In some example embodiments, the resistance values of the resistive devices 114 and 116 are set to be substantially the same as the resistance value of the microphone 112.

Throughout this disclosure, two resistance values are considered as substantially the same when an error therebetween is no greater than +/−10.0%.

The first supply voltage node $NV_{BIAS}$ is configured to receive a supply voltage $V_{BIAS}$. The second supply voltage node $NV_{GND}$ is configured to receive a ground reference voltage $V_{GND}$. In some examples, a voltage level of the supply voltage $V_{BIAS}$ is greater than a voltage level of the ground reference voltage $V_{GND}$. In some examples, the supply voltage $V_{BIAS}$ and the ground reference voltage $V_{GND}$ are provided by a power management circuit (not shown) that functions as a low-noise power supply. In an embodiment the power management circuit is implemented on the same integrated circuit (IC) chip on which the amplification circuit 140 is disposed. Alternatively, the power management circuit is implemented outside the IC chip on which the amplification circuit 140 is disposed.

The amplification circuit 140 includes an amplifier 142, plural resistive devices 144, 145, 146, and 147, a variable resistive device 152, a DC voltage difference detector 154, and a controller 156 which are coupled together as seen in FIG. 1.

The amplifier 142 includes a first input node (labeled as "$N_{IP}$"), a second input node (labeled as "$N_{IN}$"), a first output node (labeled as "$N_{ON}$"), and a second output node (labeled as "$N_{OP}$"). In the embodiment illustrated in FIG. 1, resistive device 144 is electrically coupled between the first input node $N_{IP}$ and the first audio output node $N_{MP}$. Similarly, resistive device 145 is electrically coupled between the second input node $N_{IN}$ and the second audio output node $N_{MN}$. Resistive device 146 bypasses amplifier 142 and is electrically coupled between the first input node $N_{IP}$ and the first output node $N_{ON}$. Similarly, resistive device 147 also bypasses amplifier 142 and is electrically coupled between the second input node $N_{IN}$ and the second output node $N_{OP}$. As shown in FIG. 1, no DC blocking capacitive device is disposed between the first input node $N_{IP}$ and the first audio output node $N_{MP}$ or between the second input node $N_{IN}$ and the second audio output node $N_{MN}$.

In some examples, the amplifier 142 is an operational amplifier, a differential amplifier, or any other suitable type of amplifier. In some examples, the first input node $N_{IP}$ and the second input node $N_{IN}$ are a non-inverting input and an inverting input of the amplifier 142, respectively; and the first output node $N_{ON}$ and the second output node $N_{OP}$ are an inverting output and a non-inverting output of the amplifier 142, respectively. In some examples, the resistance values of the resistive devices 144 and 145 are substantially the same, e.g., R1, and the resistance values of the resistive devices 146 and 147 are substantially the same, e.g., R2. A voltage gain of the amplification circuit 140 is determined by a ratio of $$\frac{R2}{R1}.$$

In some examples, the resistance value R1 ranges from 1 k Ohms to 10 k Ohms, and the resistance value R2 ranges from 1 time to 50 times of the resistance value R1.

In some examples, the amplification circuit 140 is a programmable-gain amplifier (PGA). In some examples, the amplification circuit 140 includes a gain adjuster (e.g., gain adjuster 520 in FIG. 5) that is configured to adjust one or more of the resistance values of the resistive devices 144, 145, 146, and 147 such that the amplification circuit 140 is programmable to have different voltage gains.

The variable resistive device 152 is electrically coupled between the second input node MN and a reference voltage node $NV_{REFH}$. An electrical path is thus defined from the reference voltage node $NV_{REFH}$ to the second supply voltage node $NV_{GND}$ through the variable resistive device 152, the resistive device 145, and the resistive device 116. Thus, in this example, the resistive device 145 is electrically coupled with the reference voltage node $NV_{REFH}$ through the variable resistive device 152 and is electrically coupled with the second supply voltage node $NV_{GND}$ through the audio sensor 110.

The reference voltage node $NV_{REFH}$ is configured to receive a reference voltage $V_{REFH}$. In some examples, a voltage level of the reference voltage $V_{REFH}$ is greater than the voltage level of the ground reference voltage $V_{GND}$. In some examples, the reference voltage node $NV_{REFH}$ is electrically coupled with the first supply voltage node $NV_{BIAS}$ and receives the supply voltage $V_{BIAS}$ as the reference voltage $V_{REFH}$. Therefore, in some examples, the variable resistive device 152 is also electrically coupled with the first supply voltage node $NV_{BIAS}$.

A resistance value of the variable resistive device 152 is set to adjust an input DC voltage difference between the first input node $N_{IP}$ and the second input node $N_{IN}$ of the amplifier 142 based on an output DC voltage difference between the first output node $N_{ON}$ and the second output node $N_{OP}$ of the amplifier 142. In some examples, a range of the resistance value of the variable resistive device 152 is determined based on the resistance values of the microphone 112, the resistive devices 114, 116, and 145, and the voltage levels of the supply voltage $V_{BIAS}$ and the reference voltage $V_{REFH}$. In some examples, the range of the resistance value of the variable resistive device 152 is set to overlap with resistance value R1. In at least one example, the range of the resistance value of the variable resistive device 152 is set to overlap with a range from 0.9×R1 to 1.1×R1.

In some examples, the variable resistive device 152 is a string resistor ladder network or an R-2R resistor ladder network where the resistance value of the variable resistive device 152 is set based on a binary code.

The DC voltage difference detector 154 is configured to generate a detection result Q indicating the output DC voltage difference between the first output node $N_{ON}$ and the second output node $N_{OP}$ of the amplifier 142.

The controller 156 is configured to set the resistance value of the variable resistive device 152 via one or more control signals CTRL. When the amplification circuit 140 is in a calibration mode, the controller 156 actively adjusts the resistance value of the variable resistive device 152 based on the detection result Q in order to minimize the input DC voltage difference between the first input node $N_{IP}$ and the second input node $N_{IN}$ of the amplifier 142. When the amplification circuit 140 is in the calibration mode, the output signals at the first output node $N_{ON}$ and the second output node $N_{OP}$ of the amplifier 142 are not usable for further audio signal processing. In contrast, when the amplification circuit 140 is in an operational mode, the controller 156 sets the resistance value of the variable resistive device 152 via the one or more control signals CTRL based on a set of stored parameters, which is determined during a time duration in which the amplification circuit 140 is in the calibration mode. When the amplification circuit 140 is in the operational mode, the output signals at the first output node $N_{ON}$ and the second output node $N_{OP}$ of the amplifier 142 are usable for further audio signal processing.

Figure 2:
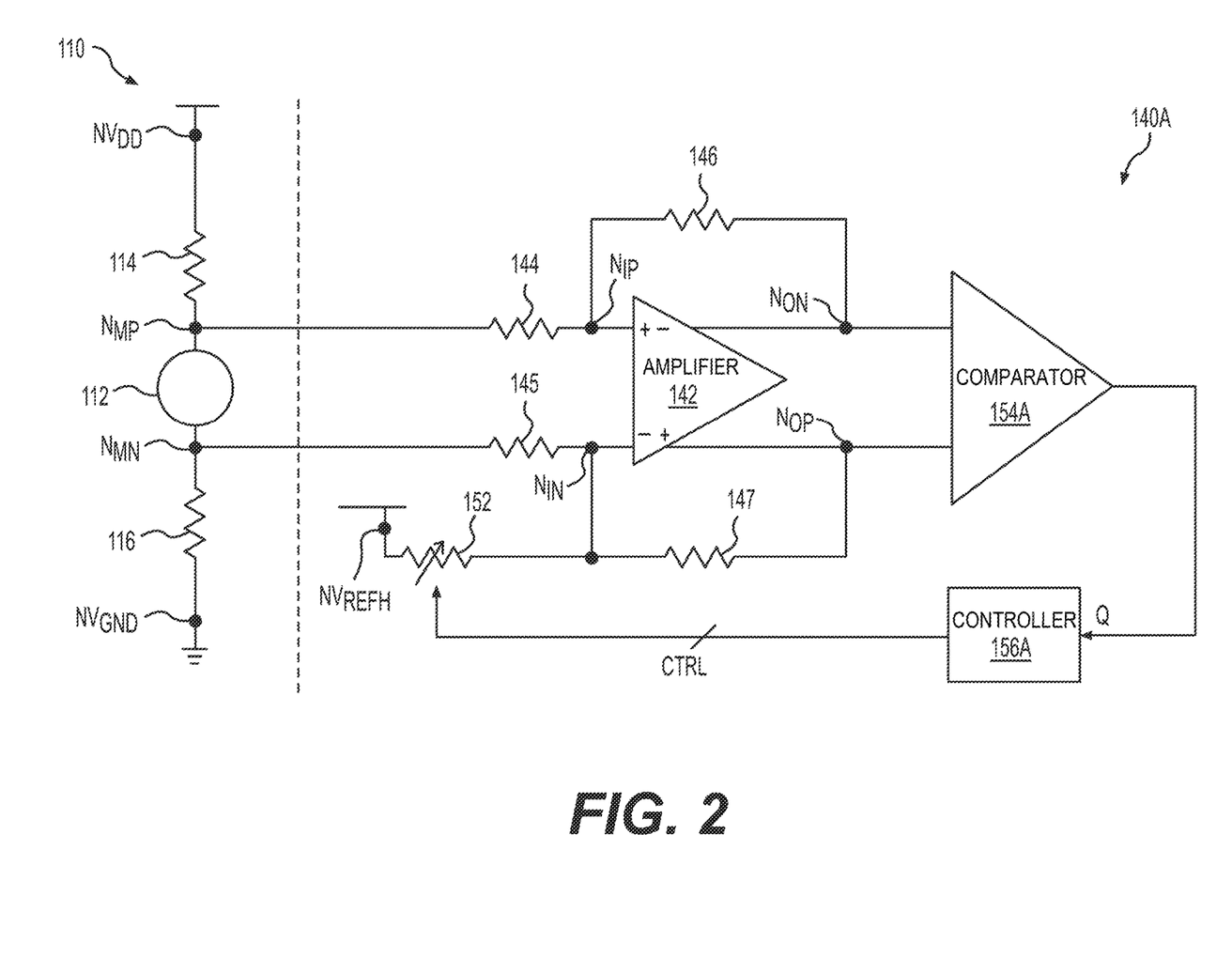
FIG. 2 shows a circuit schematic diagram of an audio sensor and an amplification circuit for implementing the audio sensor and the amplification circuit in FIG. 1 according to an embodiment of the disclosure.

FIG. 2 shows a circuit schematic diagram of an audio sensor 110 and an amplification circuit 140A according to an embodiment of the disclosure. The amplification circuit 140A corresponds to the amplification circuit 140 in FIG. 1. The components in FIG. 2 that are the same or similar to those in FIG. 1 are given the same reference numbers, and repetitive detailed description thereof is thus omitted for the purpose of clarity.

The amplification circuit 140A includes a comparator 154A additionally functions as the DC voltage difference detector 154 in FIG. 1. The amplification circuit 140A also includes a controller 156A that corresponds to the controller 156 in FIG. 1.

When the amplification circuit 140A is in the calibration mode, the comparator 154A compares a voltage level at the first output node $N_{ON}$ and a voltage level at the second output node $N_{OP}$, and generates a comparison result as the detection result Q. For example, the comparator 154A outputs a first logic level, (e.g., logic high) as the detection result Q when the voltage level at the first output node $N_{ON}$ is less than the voltage level at the second output node $N_{OP}$, and outputs a second logic level (e.g., logic low) as the detection result Q signal when the voltage level at the first output node $N_{ON}$ is greater than the voltage level at the second output node $N_{OP}$.

When the amplification circuit 140A is in the calibration mode, in some examples, the controller 156A sets the resistance value of the variable resistive device 152 by determining the binary code carried by the control signals CTRL. In some examples, the controller 156A determines the binary code, from the most-significant bit to the least significant bit, that will result in a minimum DC offset at the output nodes of the amplifier 142A based on a successive approximation (SAR) approach. In some examples, the controller 156A includes a storage to store the binary code during and after the binary code are determined based on the SAR approach.

Figure 3:
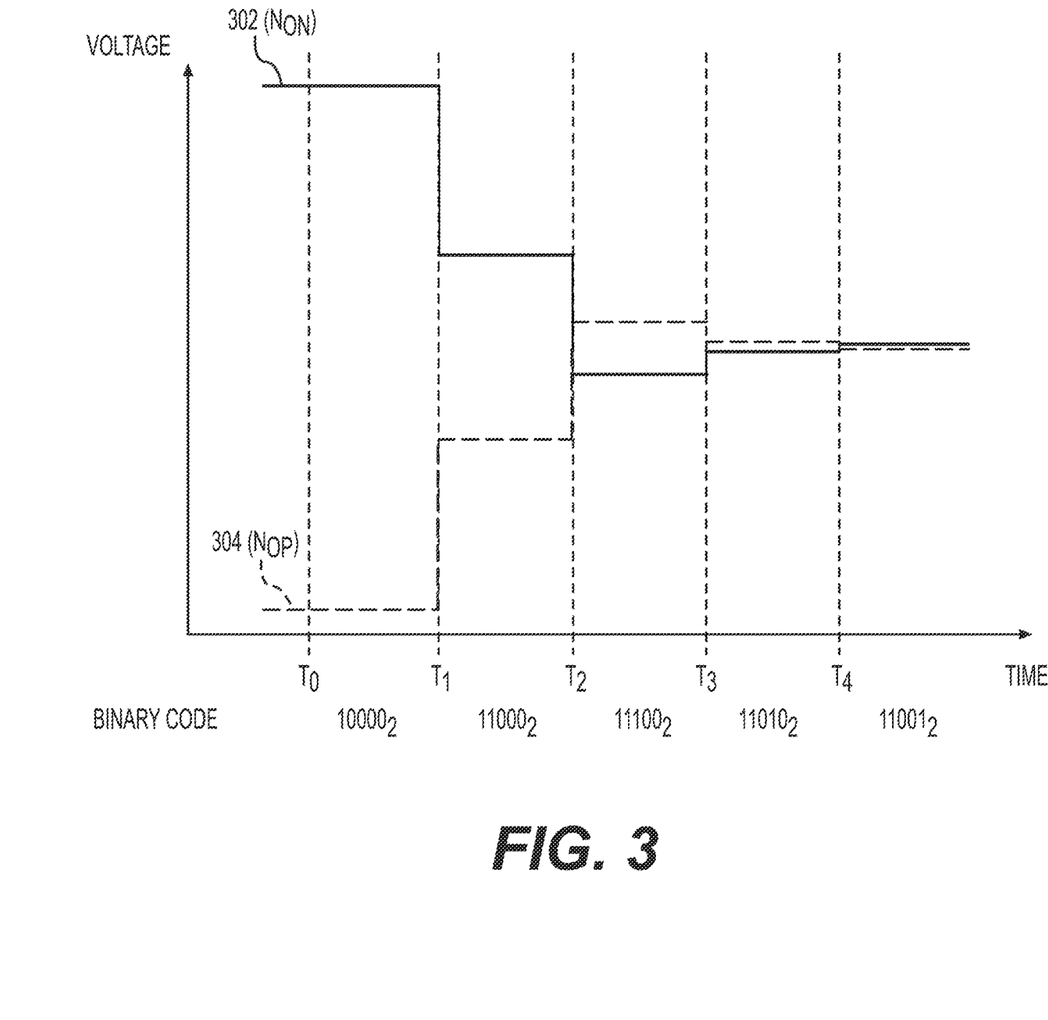
FIG. 3 shows a signal diagram of output signals of the amplification circuit in FIG. 3 according to an embodiment of the disclosure.

FIG. 3 shows a signal diagram of output signals of an amplification circuit, such as the amplification circuit 140A in FIG. 2, according to an embodiment of the disclosure. Curve 302 corresponds to the voltage level at the output node $N_{ON}$, and curve 304 corresponds to the voltage level at the output node $N_{OP}$. Also, in this example, the variable resistive device 152 is controlled by a 5-digit binary code ranging from $11111_2$ to $00000_2$, where a greater value of binary code corresponds to setting the variable resistive device 152 at a greater resistance value. In FIG. 3, the controller 156A determines the binary code for controlling the variable resistive device 152 based on an SAR approach.

For example, at time $T_0$, the controller 156A sets the first bit from the most-significant-bit (MSB) side of the binary code for controlling the variable resistive device 152 at 1 and leaves the other bits at 0 (hence, $10000_2$), which roughly corresponds to the mid-value of the range of the resistance value of the variable resistive device 152. After time $T_0$, the voltage level at the first output node $N_{ON}$ is greater than the voltage level at the second output node $N_{OP}$. Thus, the comparator 154A outputs the second logic level as the detection result Q. Accordingly, the controller 156A leaves the first bit from the MSB side of the binary code at 1 and sets the second bit from the MSB side of the binary code at 1 (hence, $11000_2$) for the next iteration in order to increase the resistance value of the variable resistive device 152.

At time $T_1$, the controller 156A sets the binary code at $11000_2$ to increase the resistance value of the variable resistive device 152, which in turn decreases the voltage level at the input node $N_{IN}$ and thus decreases the voltage level at the output node $N_{ON}$. After time $T_1$, the voltage level at the first output node $N_{ON}$ is still greater than the voltage level at the second output node $N_{OP}$. Thus, the comparator 154A outputs the second logic level as the detection result Q. Accordingly, the controller 156A leaves the second bit from the MSB side of the binary code at 1 and set the third bit from the MSB side of the binary code at 1 (hence, $11100_2$) for the next iteration in order to increase the resistance value of the variable resistive device 152.

At time $T_2$, the controller 156A sets the binary code at $11100_2$ to increase the resistance value of the variable resistive device 152, which in turn decreases the voltage level at the input node $N_{IN}$ and thus decreases the voltage level at the output node $N_{ON}$. After time $T_2$, the voltage level at the first output node $N_{ON}$ becomes less than the voltage level at the second output node $N_{OP}$. Thus, the comparator 154A outputs the first logic level as the detection result Q. Accordingly, the controller 156A reverts the third bit from the MSB side of the binary code to 0 and set the fourth bit from the MSB side of the binary code at 1 (hence, $11010_2$) for the next iteration in order to increase the resistance value of the variable resistive device 152.

At time $T_3$, the controller 156A sets the binary code at $11010_2$ to decrease the resistance value of the variable resistive device 152, which in turn increases the voltage level at the input node $N_{IN}$ and thus increases the voltage level at the output node $N_{ON}$. After time $T_3$, the voltage level at the first output node $N_{ON}$ is still less than the voltage level at the second output node $N_{OP}$. Thus, the comparator 154A outputs the first logic level as the detection result Q. Accordingly, the controller 156A reverts the fourth bit from the MSB side of the binary code to 0 and set the fifth bit from the MSB side, which is also the first bit from the least-significant-bit (LSB) side, of the binary code at 1 (hence, $11001_2$) for the next iteration in order to increase the resistance value of the variable resistive device 152.

At time $T_4$, the controller 156A sets the binary code at $11001_2$ to decrease the resistance value of the variable resistive device 152, which in turn increases the voltage level at the input node $N_{IN}$ and thus increases the voltage level at the output node $N_{ON}$. After time $T_4$, the voltage level at the first output node $N_{ON}$ becomes greater than the voltage level at the second output node $N_{OP}$. Thus, the comparator 154A outputs the second logic level as the detection result Q. Accordingly, the controller 156A leaves the first bit from the LSB side of the binary code at 1.

In this example, the binary code for setting the resistance value of the variable resistive device 152 is thus determined to be $11001_2$. In some examples, the controller 154A further stores the determined binary code in a storage device, disposed either inside the controller 154A or outside the controller 154A. As such, when the amplification circuit 140A is in the operation mode, the controller 156 sets the resistance value of the variable resistive device 152 based on a the stored binary code that is determined during the period when the amplification circuit 140A is in the calibration mode.

Figure 4:
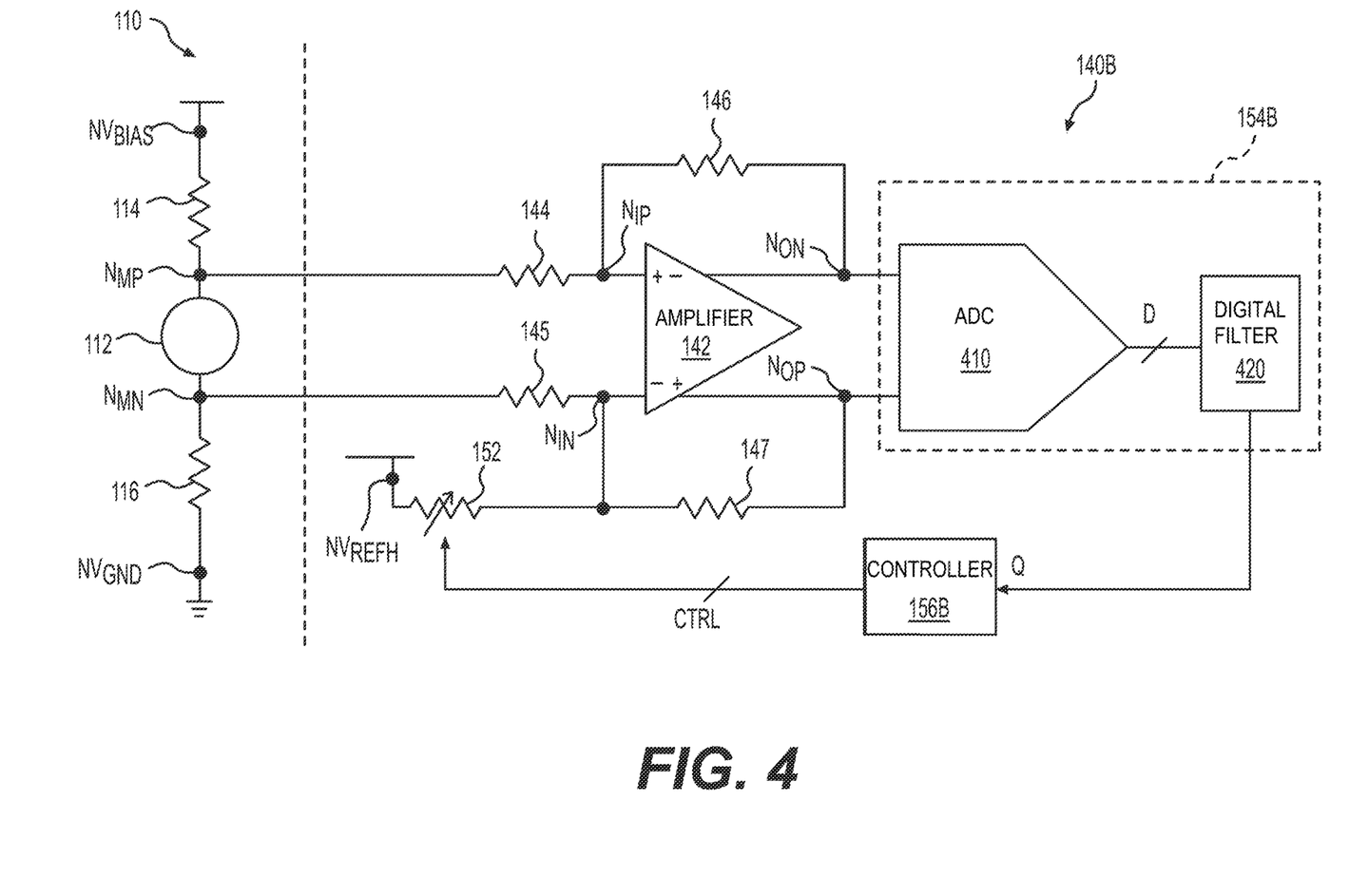
FIG. 4 shows a circuit schematic diagram of an audio sensor and an amplification circuit for implementing the audio sensor and the amplification circuit in FIG. 1 according to another embodiment of the disclosure.

FIG. 4 shows a circuit schematic diagram of an audio sensor 110 and an amplification circuit 140B according to another embodiment of the disclosure. The amplification circuit 140B corresponds to the amplification circuit 140 in FIG. 1. The components in FIG. 4 that are the same or similar to those in FIG. 1 are given the same reference numbers, and detailed repetitive description thereof is thus omitted.

The amplification circuit 140B includes an analog-to-digital converter (ADC) 410, a digital filter 420, and a controller 156B. The combination of the ADC 410 and the digital filter 420 functions as a DC voltage difference detector 154B that corresponds to the DC voltage difference detector 154 in FIG. 1. The controller 156B that corresponds to the controller 156 in FIG. 1.

When the amplification circuit 140B is in the calibration mode, in some examples, the ADC 410 generates a digital value D corresponding to a voltage difference between the first output node $N_{ON}$ and the second output node $N_{OP}$. When the amplification circuit 140A is in the calibration mode, in some examples, the digital filter 420 extracts a DC component corresponding to the output DC voltage difference between the first output node $N_{ON}$ and the second output node $N_{OP}$ as the detection result Q. In some examples, the digital filter 420 only outputs the polarity of the extracted DC component corresponding to the output DC voltage difference as the detection result Q.

In some examples, when the amplification circuit 140B is in the operational mode, the ADC 410 is either disabled or used as an ADC for processing the amplified audio signal from the first output node $N_{ON}$ and the second output node $N_{OP}$.

In some examples, the ADC 410 is a Delta-Sigma Modulation ADC. In some other examples, the ADC 410 can be other types of ADC, such as a flash ADC, an SAR ADC, a ramp-compared ADC, or any other suitable types of ADC.

In some examples, when the amplification circuit 140B is in the calibration mode, the controller 156B sets the resistance value of the variable resistive device 152 by determining the binary code carried by the control signals CTRL. In some examples, when the digital filter 420 only outputs the polarity of the extracted DC component corresponding to the output DC voltage difference as the detection result Q, the controller 156B determines the binary code, from the most-significant bit to the least significant bit, based on a successive approximation (SAR) approach in a manner similar to the example illustrated in FIGS. 2 and 3. In some examples, when the digital filter 420 outputs the extracted DC component value as the detection result Q, the controller 156B calculates the binary code based on a predetermined equation or a predetermined look-up table.

Figure 5:
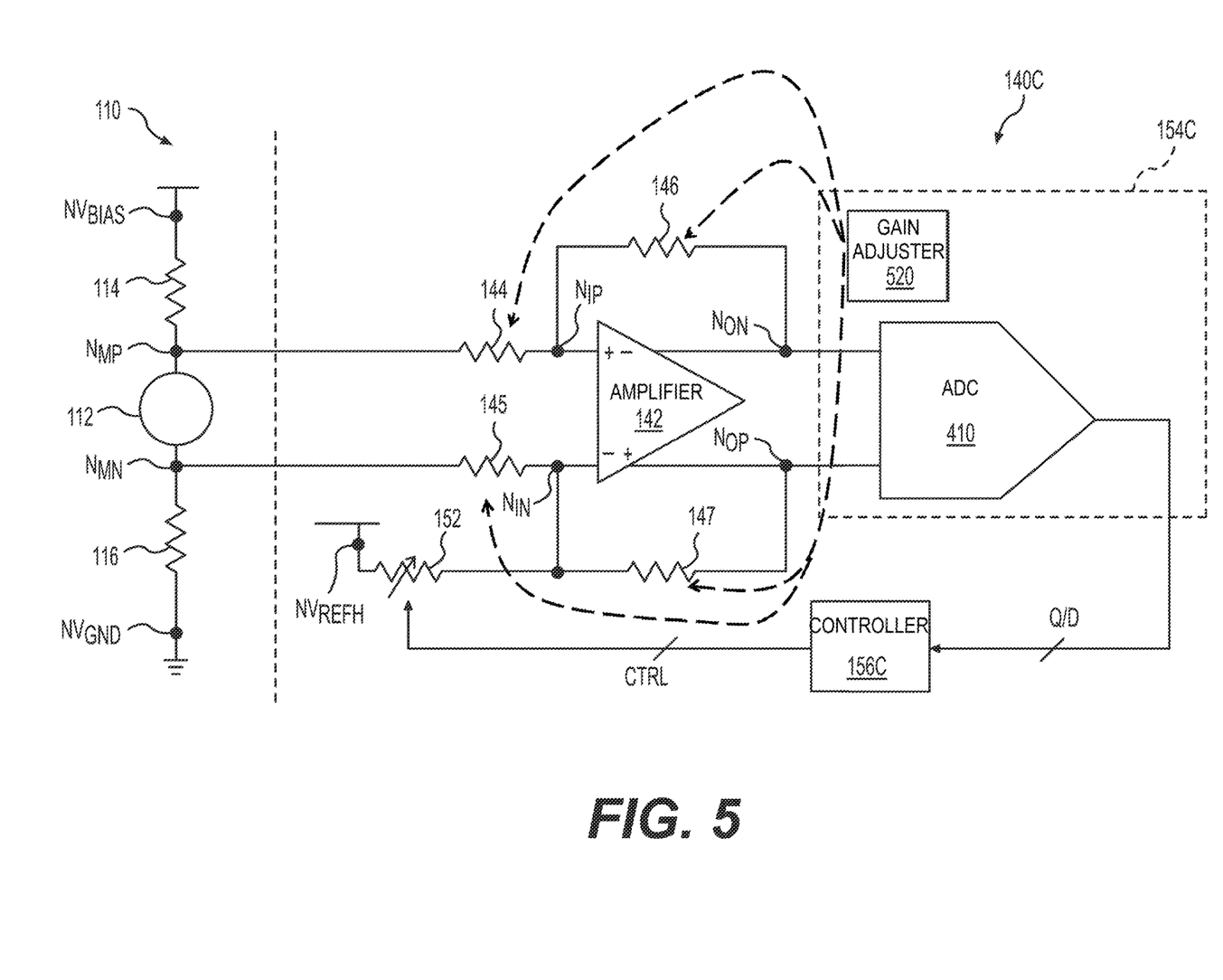
FIG. 5 shows a circuit schematic diagram of an audio sensor and an amplification circuit for implementing the audio sensor and the amplification circuit in FIG. 1 according to another embodiment of the disclosure.

FIG. 5 shows a circuit schematic diagram of an audio sensor 110 and an amplification circuit 140C according to another embodiment of the disclosure. The amplification circuit 140C corresponds to the amplification circuit 140 in FIG. 1. The components in FIG. 5 that are the same or similar to those in FIG. 1 or FIG. 4 are given the same reference numbers, and detailed repetitive description thereof is thus omitted.

The amplification circuit 140C includes an analog-to-digital converter (ADC) 410, a gain adjuster 520, and a controller 156C. The combination of the ADC 410 and the gain adjuster 520 functions as a DC voltage difference detector 154C that corresponds to the DC voltage difference detector 154 in FIG. 1. The controller 156C that corresponds to the controller 156 in FIG. 1.

In some examples, when the amplification circuit 140C is in the operational mode, the ADC 410 is either disabled or used as an ADC for processing the amplified audio signal from the first output node $N_{ON}$ and the second output node $N_{OP}$. In some examples, when the amplification circuit 140C is in the operation mode, the gain adjuster 520 is either disabled or used as a gain adjuster for programming the voltage gain of the amplification circuit 140C.

When the amplification circuit 140C is in the calibration mode, the gain adjuster 520 sets the voltage gain of the amplification circuit 140C at a unit gain (i.e., the amplification gain is set to one) by setting the resistance values of the resistive devices 144, 145, 146, and 147. In some examples, the ADC 410 generates a digital value D corresponding to a voltage difference between the first output node $N_{ON}$ and the second output node $N_{OP}$. Inasmuch as the voltage gain of the amplification circuit 140C is set to the unit gain, the digital value D also represents a voltage difference between the first input node $N_{IP}$ and the second input node $N_{IN}$. In some examples, the ADC 140 outputs the digital value D as the detection result Q or outputs the polarity of the digital value D as the detection result Q.

In some examples, when the amplification circuit 140C is in the calibration mode, the controller 156C sets the resistance value of the variable resistive device 152 by determining the binary code carried by the control signals CTRL. In some examples, when the ADC 410 outputs the polarity of the digital value D as the detection result Q, the ADC 410 functions as the comparator 154A in FIG. 2. In such scenario, the controller 156C determines the binary code, from the most-significant bit to the least significant bit, based on a successive approximation (SAR) approach in a manner similar to the example illustrated in FIGS. 2 and 3. In some examples, when the ADC 410 outputs the digital value D as the detection result Q, the controller 156C calculates the binary code based on a predetermined equation or a predetermined look-up table.

Figure 6:
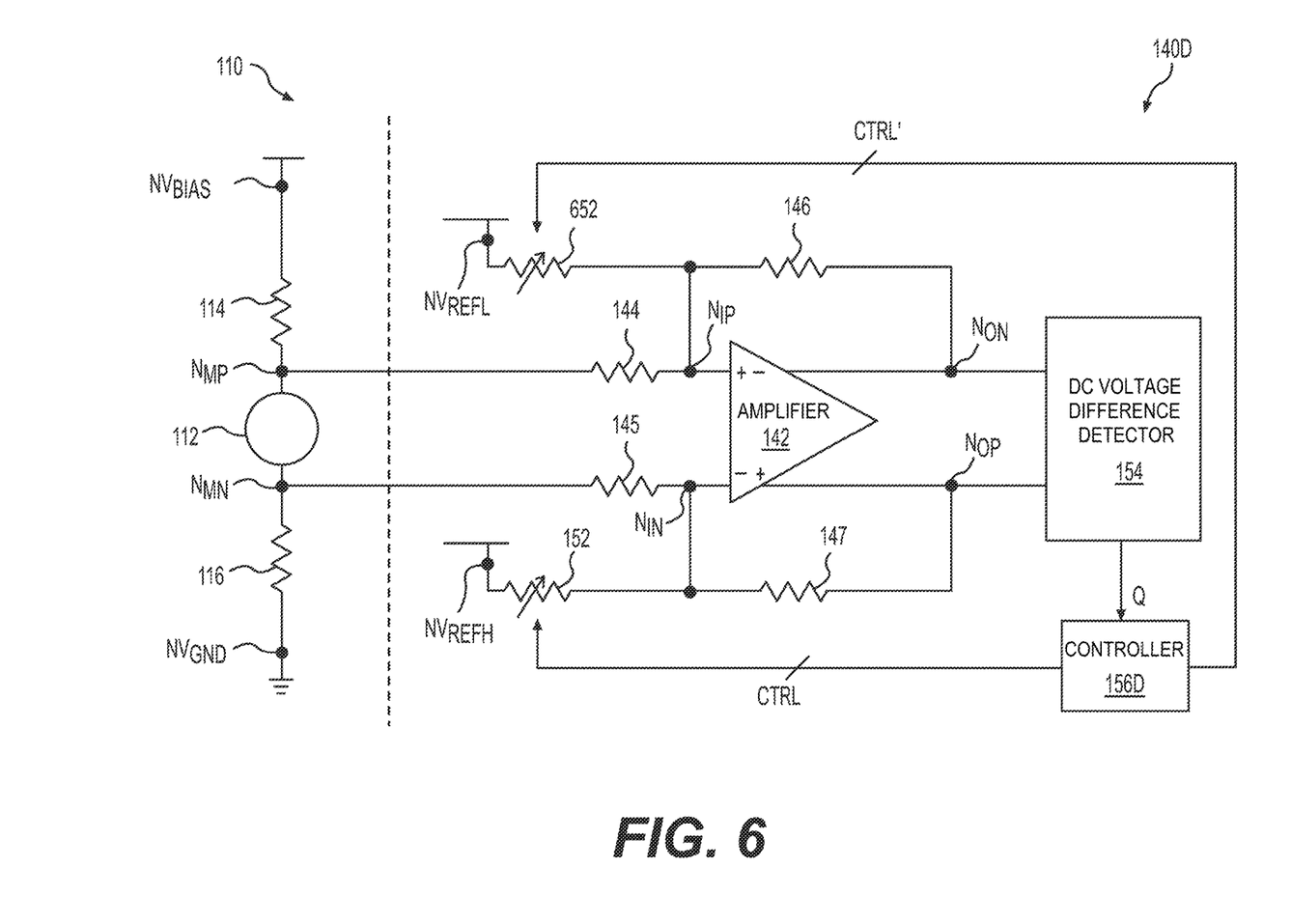
FIG. 6 shows a circuit schematic diagram of an audio sensor and an amplification circuit according to another embodiment of the disclosure.

FIG. 6 shows a circuit schematic diagram of an audio sensor 110 and an amplification circuit 140D according to another embodiment of the disclosure. The amplification circuit 140D corresponds to the amplification circuit 140 in FIG. 1. The components in FIG. 6 that are the same or similar to those in FIG. 1 are given the same reference numbers, and detailed repetitive description thereof is thus omitted.

The amplification circuit 140D includes a controller 156D that corresponds to the controller 156 in FIG. 1. The amplification circuit 140D further includes another variable resistive device 652 that is electrically coupled between the first input node $N_{IP}$ and another reference voltage node $NV_{REFL}$. An electrical path is thus defined from the reference voltage node $NV_{REFL}$ to the first supply voltage node $NV_{BIAS}$ through the variable resistive device 652, the resistive device 144, and the resistive device 114. Thus, in some examples, the resistive device 144 is electrically coupled with the reference voltage node $NV_{REFL}$ through the variable resistive device 652 and is electrically coupled with the first supply voltage node $NV_{BIAS}$ through the audio sensor 110.

The reference voltage node $NV_{REFL}$ is configured to receive a reference voltage $V_{REFL}$. In some examples, a voltage level of the reference voltage $V_{REFL}$ is less than the voltage level of the supply voltage $V_{BIAS}$. In some examples, the reference voltage node $NV_{REFL}$ is electrically coupled with the second supply voltage node $NV_{GND}$ and receives the ground reference voltage $V_{GND}$ as the reference voltage $V_{REFL}$. Therefore, in some examples, the variable resistive device 652 is also electrically coupled with the second supply voltage node $NV_{GND}$.

A resistance value of the variable resistive device 652 is set to adjust the input DC voltage difference between the first input node $N_{IP}$ and the second input node $N_{IN}$ of the amplifier 142 based on the output DC voltage difference between the first output node $N_{ON}$ and the second output node $N_{OP}$ of the amplifier 142. In some examples, a range of the resistance values of the variable resistive device 652 is determined based on the resistance values of the microphone 112, the resistive devices 114, 116, and 144, and the voltage levels of the supply voltage $V_{BIAS}$ and the reference voltage $V_{REFH}$. In some examples, the range of the resistance value of the variable resistive device 652 is set to overlap with resistance value R1. In at least one example, the range of the resistance value of the variable resistive device 652 is set to overlap with a range from 0.9×R1 to 1.1×R1. In some examples, the range of the resistance value of the variable resistive device 652 is set to be substantially the same as the range of the resistance value of the variable resistive device 152.

The controller 156D is configured to set the resistance value of the variable resistive device 152 via one or more control signals CTRL as illustrated above in conjunction with FIGS. 1-5. The controller 156D is also configured to set the resistance value of the variable resistive device 652 via one or more control signals CTRL' in a manner similar to that of setting the resistance value of the variable resistive device 152. When the amplification circuit 140D is in a calibration mode, the controller 156D actively adjusts the resistance value of the variable resistive device 152 and the resistance value of the variable resistive device 652 based on the detection result Q in order to minimize the input DC voltage difference between the first input node $N_{IP}$ and the second input node $N_{IN}$ of the amplifier 142. In contrast, when the amplification circuit 140D is in an operational mode, in some examples, the controller 156D sets the resistance value of the variable resistive device 152 via the one or more control signals CTRL and sets the resistance value of the variable resistive device 652 via the one or more control signals CTRL' based on a set of stored parameters, which is determined during a duration that the amplification circuit 140D is in the calibration mode.

When the amplification circuit 140D is in the calibration mode, in some examples, the controller 156D adjusts the resistance value of the variable resistive device 152 and the resistance value of the variable resistive device 652 separately or jointly. When the amplification circuit 140D is in the calibration mode, in some examples, the controller 156D adjusts the resistance value of the variable resistive device 152 and the resistance value of the variable resistive device 652 based on a same approach illustrated above in conjunction with FIGS. 1-5. In some examples, the controller 156D adjusts the resistance value of the variable resistive device 152 and the resistance value of the variable resistive device 652 each based on a different approach illustrated above in conjunction with FIGS. 1-5. Detailed description of adjusting the resistance value of the variable resistive device 152 and the resistance value of the variable resistive device 652 is thus omitted.

In some examples, instead of using the variable resistive device 152 or both the variable resistive device 152 and the variable resistive device 652 to control the input DC voltage difference between input nodes $N_{IP}$ and $N_{IN}$, an amplification circuit 140D relies on using only the variable resistive device 652. In such case, the variable resistive device 152, the one or more control signals CTRL, and the reference voltage node $NV_{REFH}$ is omitted.

Figure 7:
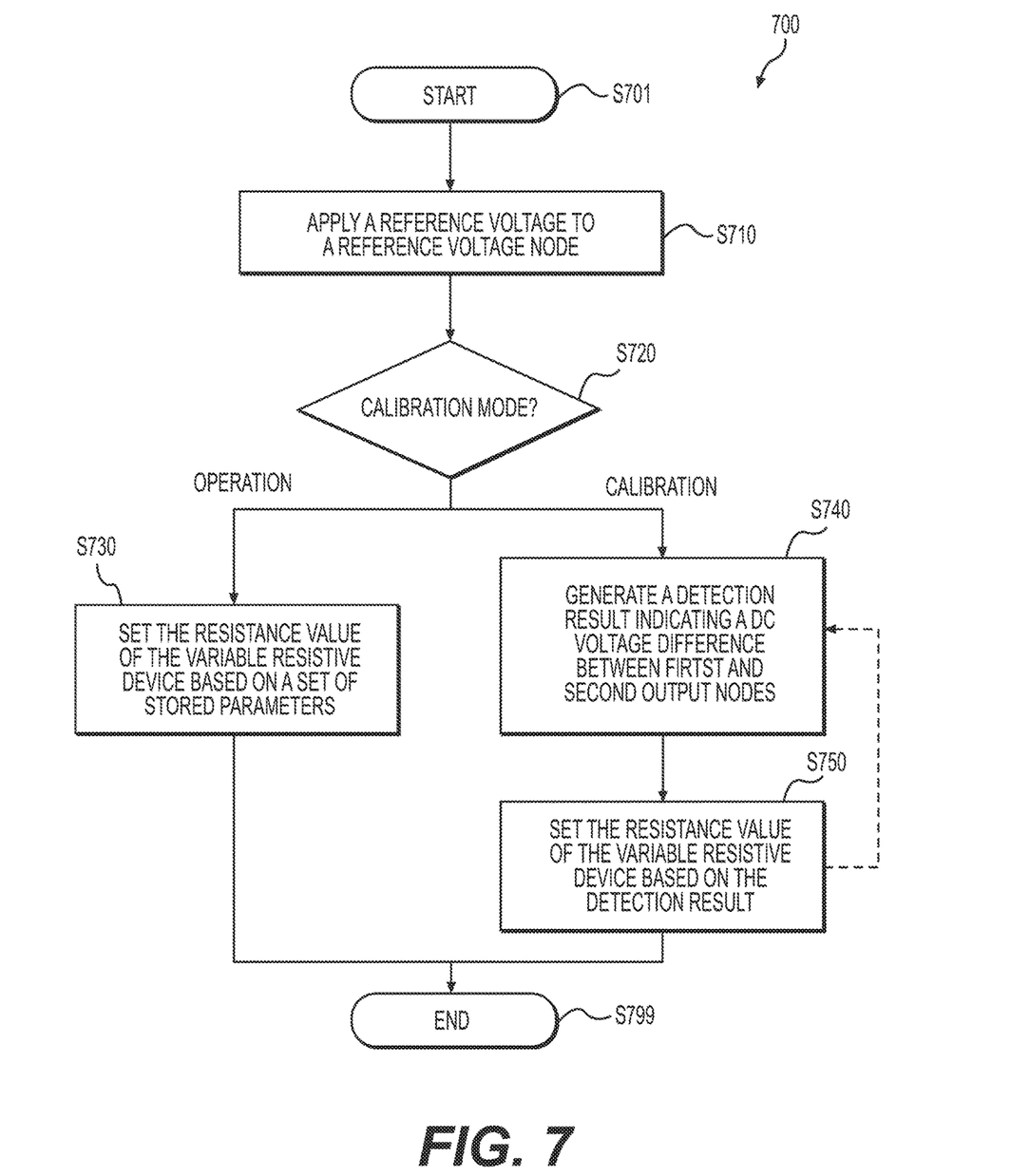
FIG. 7 shows a flow chart outlining an example process for adjusting an input DC voltage difference of an amplification circuit, such as one of the amplification circuits in FIGS. 1, 2, and 4-6, according to an embodiment of the disclosure.

FIG. 7 shows a flow chart outlining an example process 700 for adjusting an input DC voltage difference between first and second input nodes of an amplifier of an amplification circuit according to an embodiment of the disclosure. In an example, the process 700 is performed by the amplification circuit 140 in FIG. 1 or the amplification circuit 140A-140D as illustrated above. The process 700 starts at S701 and proceeds to S710.

At S710, a reference voltage is applied to a reference voltage node. A variable resistive device is electrically coupled between the reference voltage node and an input node of the amplification circuit. For example, in the amplification circuit 140D (FIG. 6), a reference voltage $V_{REFH}$ is applied to the reference voltage node $NV_{REFH}$ or a reference voltage $V_{REFL}$ is applied to the reference voltage node $NV_{REFL}$. In some examples, the reference voltage node $NV_{REFH}$ receives the supply voltage $V_{BIAS}$ as the reference voltage $V_{REFH}$. In some examples, the reference voltage node $NV_{REFL}$ receives the ground reference voltage $V_{GND}$ as the reference voltage $V_{REFL}$.

At S720, a determination with respect to whether the amplification circuit is in an operational mode or in a calibration mode is made. When the amplification circuit is in the operational mode, the process proceeds to S730. When the amplification circuit is in the calibration mode, the process proceeds to S740.

At S730, when the amplification circuit is in the operational mode, a resistance value of the variable resistive device is set based on a set of stored settings. For example, the resistance value of the variable resistive device 152 or the resistance value of the variable resistive device 652 is set by the controller 156D based on a set of stored settings, such as one or more binary codes stored in a storage device.

At S740, when the amplification circuit is in the calibration mode, a detection result indicating the output DC voltage difference between a first output node and a second output node of the amplifier is generated. For example, a detection result Q indicating the output DC voltage difference between the first output node $N_{ON}$ and the second output node $N_{OP}$ of the amplifier 142 is generated by a DC voltage difference detector 154. In some examples, the DC voltage difference detector 154 generates the detection result Q based on any one of the approaches illustrated in conjunction with FIGS. 1-6 or a suitable variation thereof.

At S750, when the amplification circuit is in the calibration mode, the resistance value of the variable resistive device is set based on the detection result. For example, the resistance value of the variable resistive device 152 or the resistance value of the variable resistive device 652 is set by the controller 156 or 156A-156D based on the detection result Q. In some examples, the controller 156 or 156A-156D sets the resistance value of the variable resistive device 152 or the resistance value of the variable resistive device 652 based on any one of the approaches illustrated in conjunction with FIGS. 1-6 or a suitable variation thereof.

In some examples, after S750, the process proceeds back to S740 in order to refine the resistance value of the variable resistive device using a plurality of iteration by repetitively performing S740 and S750.

After S730, or after S750 when the resistance value of the variable resistive device has been determined, the process proceeds to S799 and terminates.

While aspects of the present disclosure have been described in conjunction with the specific embodiments thereof that are proposed as examples, alternatives, modifications, and variations to the examples may be made. Accordingly, embodiments as set forth herein are intended to be illustrative and not limiting. There are changes that may be made without departing from the scope of the claims set forth below.

What is claimed is:

1. An amplification circuit, comprising:
   an amplifier configured to amplify first and second input electrical signals, the amplifier including:
      first and second input nodes configured to receive the first and second input electrical signals; and
      first and second output nodes configured to output first and second output electrical signals having amplified voltages relative to the first and second input electrical signals;
   a direct current (DC) voltage difference detector configured to generate a detection result indicating a DC voltage difference between the first and second output electrical signals;
   a first variable resistive device electrically coupled to the second input node of the amplifier, the first variable resistive device being configured to have a resistance value to compensate for a DC voltage difference between the first and second input electrical signals, based on the DC voltage difference between first and second output electrical signals that are output from the first and second output nodes of the amplifier; and
   a controller configured to determine a set of settings, for setting the resistance value of the first variable resistive device, based on the detection result when the amplification circuit is in a calibration mode.

2. The amplification circuit of claim 1, further comprising a first reference voltage node configured to receive a first reference voltage, wherein the first variable resistive device is electrically coupled between the second input node of the amplifier and the first reference voltage node.

3. The amplification circuit of claim 1, wherein
   the set of settings for setting the resistance value of the first variable resistive device includes a binary code, and
   the controller is configured to determine the binary code based on a successive approximation approach.

4. The amplification circuit of claim 1, wherein the DC voltage difference detector comprises a comparator configured to
   compare a voltage level of the first output electrical signal at the first output node of the amplifier and a voltage level of the second output electrical signal at the second output node of the amplifier, and
   generate a comparison result from comparing the respective voltage levels of the first output electrical signal and the second output electrical signal, and to apply the comparison result as the detection result.

5. The amplification circuit of claim 1, wherein the DC voltage difference detector comprises:
an analog-to-digital converter configured to generate a digital value corresponding to a voltage difference between voltage at the first output node of the amplifier and voltage at the second output node of the amplifier; and
a digital filter configured to extract a DC component corresponding to the DC voltage difference between the first and second output electrical signals as the detection result.

6. The amplification circuit of claim 1, wherein
the DC voltage difference detector comprises an analog-to-digital converter configured to generate a digital value corresponding to a voltage difference between the first output node of the amplifier and the second output node of the amplifier; and
the controller is configured to
calculate the set of settings for setting the resistance value of the first variable resistive device based on the digital value when the amplification circuit is in the calibration mode and a voltage gain of the amplification circuit is set to a unit gain, and
set the resistance value of the first variable resistive device based on the calculated set of settings.

7. The amplification circuit of claim 1, further comprising:
a second variable resistive device electrically coupled to the first input node of the amplifier, the second variable resistive device being configured to have a respective resistance value to compensate for the DC voltage difference between the first and second input electrical signals, based on the DC voltage difference between the first and second output electrical signals that are output from the first and second output nodes of the amplifier.

8. The amplification circuit of claim 7, further comprising a second reference voltage node configured to receive a second reference voltage, wherein the second variable resistive device is electrically coupled between the first input node of the amplifier and the second reference voltage node.

9. An audio sensing circuit, comprising:
an audio sensor electrically coupled between first and second supply voltage nodes;
an amplifier configured to amplify first and second input electrical signals, the amplifier including:
first and second input nodes configured to receive the first and second input electrical signals, and
first and second output nodes configured to output first and second output electrical signals having amplified voltages relative to the first and second input electrical signals;
a set of resistive devices electrically coupled between the second input node of the amplifier and the second supply voltage node, the audio sensor being coupled to the second input node through a first portion of the set of resistive devices and coupled to the second supply voltage node through a second portion of the set of resistive devices; and
a variable resistive device electrically coupled to the second input node of the amplifier, the variable resistive device being configured to have a selected resistance value to compensate for a direct current (DC) voltage difference between the first and second input electrical signals based on a DC voltage difference between the first and second output electrical signals that are output from the first and second output nodes of the amplifier.

10. The audio sensing circuit of claim 9, wherein the variable resistive device is electrically coupled between the second input node of the amplifier and the first supply voltage node.

11. The audio sensing circuit of claim 9, further comprising:
a DC voltage difference detector configured to generate a detection result indicating the DC voltage difference between the first and second output electrical signals; and
a controller configured to determine a set of settings, for setting the resistance value of the variable resistive device, based on the detection result when the audio sensing circuit is in a calibration mode.

12. The audio sensing circuit of claim 11, wherein
the set of settings for setting resistance value of the variable resistive device includes a binary code, and
the controller is configured to determine the binary code based on a successive approximation approach.

13. The audio sensing circuit of claim 11, wherein the DC voltage difference detector comprises a comparator configured to
compare a voltage level of the first output electrical signal at the first output node of the amplifier and a voltage level of the second output electrical signal at the second output node of the amplifier, and
generate a comparison result from comparing the respective voltage levels of the first output electrical signal and the second output electrical signal, and to apply the comparison result as the detection result.

14. The audio sensing circuit of claim 11, wherein the DC voltage difference detector comprises:
an analog-to-digital converter configured to generate a digital value corresponding to a voltage difference between voltage at the first output node of the amplifier and voltage at the second output node of the amplifier; and
a digital filter configured to extract a DC component corresponding to the DC voltage difference between the first and second output electrical signals, and to output the extracted DC component as the detection result.

15. The audio sensing circuit of claim 11, wherein
the DC voltage difference detector comprises an analog-to-digital converter configured to generate a digital value corresponding to a voltage difference between the first output node of the amplifier and the second output node of the amplifier; and
the controller is configured to
calculate the set of settings for setting the resistance value of the variable resistive device based on the digital value when the audio sensing circuit is in the calibration mode and a voltage gain of the audio sensing circuit is set to a unit gain, and
set the resistance value of the variable resistive device based on the calculated set of settings.

16. A method of adjusting an input direct current (DC) voltage difference between first and second input electrical signals at first and second input nodes of an amplifier of an amplification circuit, the method comprising:
generating a detection result indicating a DC voltage difference between first and second output electrical signals that are output from first and second output nodes of the amplifier;
determining a set of settings, for setting a resistance value of a variable resistive device, based on the detection result when the amplification circuit is in a calibration mode; and setting the variable resistive device electrically coupled to the second input node of the amplifier to have the resistance value to compensate for the DC voltage difference between the first and second input electrical signals at the first and second input nodes of the amplifier based on the DC voltage difference between the first and second output electrical signals that are output from the first and second output nodes of the amplifier.

17. The method of claim 16, further comprising applying a reference voltage to a reference voltage node, the variable resistive device being electrically coupled between the reference voltage node and the second input node of the amplification circuit.

18. The method of claim 16, wherein
the set of settings for setting resistance value of the variable resistive device includes a binary code, and
the method further comprises determining the binary code for setting the resistance value of the variable resistive device based on a successive approximation approach.

* * * * *